US012057335B2

(12) United States Patent
Lee et al.

(10) Patent No.: US 12,057,335 B2
(45) Date of Patent: Aug. 6, 2024

(54) APPARATUS FOR TREATING SUBSTRATE AND APPARATUS FOR MEASURING CONCENTRATION

(71) Applicant: SEMES CO., LTD., Cheonan-si (KR)

(72) Inventors: Sang Min Lee, Seoul (KR); Jin Se Park, Incheon (KR); Ki Hoon Choi, Cheonan-si (KR)

(73) Assignee: SEMES CO., LTD., Chungcheongnam-do (KR)

( * ) Notice: Subject to any disclaimer, the term of this patent is extended or adjusted under 35 U.S.C. 154(b) by 0 days.

(21) Appl. No.: 17/957,428

(22) Filed: Sep. 30, 2022

(65) Prior Publication Data

US 2023/0111149 A1 Apr. 13, 2023

(30) Foreign Application Priority Data

Oct. 8, 2021 (KR) ........................ 10-2021-0133588

(51) Int. Cl.
*G01N 1/10* (2006.01)
*G01N 1/20* (2006.01)
*H01L 21/67* (2006.01)
*H01L 21/66* (2006.01)

(52) U.S. Cl.
CPC ......... H01L 21/67253 (2013.01); G01N 1/10 (2013.01); *H01L 21/67034* (2013.01)

(58) Field of Classification Search
CPC ......... H01L 21/67253; H01L 21/67034; H01L 21/67017; H01L 21/67103; H01L 21/6719; H01L 22/26; G01N 1/10; G01N 2001/105; G01N 2001/205
See application file for complete search history.

(56) References Cited

FOREIGN PATENT DOCUMENTS

| CN | 207993814 U | * | 10/2018 | ............. H01L 21/67 |
|---|---|---|---|---|
| JP | 2013-16797 A | | 1/2013 | |
| JP | 2018-60895 A | | 4/2018 | |
| JP | 2018-82099 A | | 5/2018 | |
| KR | 100551586 B1 | | 2/2006 | |
| KR | 101363265 B1 | | 2/2014 | |
| KR | 101513591 B1 | | 4/2015 | |

(Continued)

OTHER PUBLICATIONS

Japanese Office Action dated Dec. 12, 2023 issued in Japanese Patent Application No. 2022-160732.

*Primary Examiner* — Herbert K Roberts
*Assistant Examiner* — Anthony W Megna Fuentes
(74) *Attorney, Agent, or Firm* — Harness, Dickey & Pierce, P.L.C.

(57) ABSTRACT

Provided is a concentration measuring apparatus, which measures a concentration of a fluid under a high-pressure environment, such as an environment in which a supercritical fluid is provided. The concentration measuring apparatus includes: a concentration meter for measuring a concentration of a first fluid contained in a fluid in the measurement line; a sampling line for transferring a process fluid of a processing space in which a substrate is treated in a high-pressure environment to the measurement line; a control valve for opening and closing the sampling line; a fluid pressure regulator installed downstream the control valve in the sampling line and configured to adjust the passing fluid to a set pressure; and a decompression tank installed between the sampling line and the measurement line.

10 Claims, 12 Drawing Sheets

(56) References Cited

FOREIGN PATENT DOCUMENTS

| KR | 20150051110 A | * | 5/2015 | ........... H01L 21/302 |
|---|---|---|---|---|
| KR | 101621485 B1 | | 5/2016 | |
| KR | 101847840 B1 | | 4/2018 | |
| KR | 101910801 B1 | | 1/2019 | |

* cited by examiner

APPARATUS FOR TREATING SUBSTRATE AND APPARATUS FOR MEASURING CONCENTRATION

CROSS-REFERENCE TO RELATED APPLICATIONS

This application claims priority to and the benefit of Korean Patent Application No. 10-2021-0133588 filed in the Korean Intellectual Property Office on Oct. 8, 2021, the entire contents of which are incorporated herein by reference.

TECHNICAL FIELD

The present invention relates to an apparatus for treating a substrate and an apparatus for measuring a concentration.

BACKGROUND ART

In general, a semiconductor device is manufactured from a substrate, such as a wafer. In particular, the semiconductor device is manufactured by forming a fine circuit pattern on an upper surface of a substrate by performing a deposition process, a photolithography process, a cleaning process, a drying process, an etching process, and the like.

In general, the cleaning process includes a chemical treatment to remove foreign substances on a substrate by supplying chemicals to the substrate, a rinse treatment to remove the chemical remaining on the substrate by supplying a liquid to the substrate, and a drying treatment to remove the liquid remaining on the substrate.

A supercritical fluid is used for the drying treatment of the substrate. According to one example, after replacing pure water on the substrate with an organic solvent, the supercritical fluid is supplied to the substrate in a vessel to dissolve the organic solvent remaining on the substrate in the supercritical fluid and remove the organic solvent from the substrate. As an example of the organic solvent, isopropyl alcohol (hereinafter, IPA) is used. As an example of the supercritical fluid, carbon dioxide ($CO_2$), which has relatively low critical temperature and critical pressure, and in which IPA is well soluble, is used.

Since the inside of the vessel is under high pressure during the process, it is impossible to measure the concentration of organic solvent contained in the supercritical fluid in real time during the process. In addition, an indirect method of measuring the concentration of residual fumes after completion of the process may be used, but it is not possible to observe the change in the concentration of a chemical liquid, such as an organic solvent, inside the vessel in real time.

SUMMARY OF THE INVENTION

The present invention has been made in an effort to provide a substrate treating apparatus capable of efficiently treating a substrate.

The present invention has been made in an effort to provide a substrate treating apparatus and a concentration measuring apparatus which are capable of measuring the concentration of a chemical liquid at a predetermined time point at which the concentration measurement is desired even during a process.

The present invention has been made in an effort to provide a substrate treating apparatus and a concentration measuring apparatus which are capable of monitoring the concentration of a chemical liquid during a process and thus improving process performance.

The problem to be solved by the present invention is not limited to the above-mentioned problems. The problems not mentioned will be clearly understood by those skilled in the art from the descriptions below.

An exemplary embodiment of the present invention provides an apparatus for measuring a concentration, which measures a concentration of a fluid under a high-pressure environment, such as an environment in which a supercritical fluid is provided, the apparatus including: a concentration meter for measuring a concentration of a first fluid contained in a fluid in the measurement line; a sampling line for transferring a process fluid of a processing space in which a substrate is treated in a high-pressure environment to the measurement line; a control valve for opening and closing the sampling line; a fluid pressure regulator installed downstream the control valve in the sampling line and configured to adjust the passing fluid to a set pressure; and a decompression tank installed between the sampling line and the measurement line.

In the exemplary embodiment, the apparatus may further include: a purge gas supply line connected to the decompression tank; and a purge valve installed in the purge gas supply line.

In the exemplary embodiment, the apparatus may further include: a purge gas supply line connected to the decompression tank; and a purge valve installed in the purge gas supply line.

In the exemplary embodiment, the apparatus may further include a controller, in which when the concentration measurement by the concentration meter is completed, the controller may supply purge gas to the decompression tank by opening the purge valve.

In the exemplary embodiment, the apparatus may further include: a vent line connected to the decompression tank to vent an inside of the decompression tank; and a vent valve installed in the vent line.

In the exemplary embodiment, an inner diameter of the vent line may be larger than an inner diameter of the measurement line.

In the exemplary embodiment, the apparatus may further include a controller, in which the controller may open the control valve to sample the process fluid at a predetermined time point during the progress of the treatment of the substrate with the process fluid in the processing space, and measure the concentration of the first fluid contained in the process fluid.

In the exemplary embodiment, the control valve may open for a few seconds and then close.

In the exemplary embodiment, when the concentration of the first fluid measured by the concentration meter is equal to or less than a set value, the treatment of the substrate by using the process fluid may be terminated.

In the exemplary embodiment, the apparatus may further include a controller, in which the controller may set the control valve to an open state at a predetermined time point during the progress of the treatment of a first substrate with the process fluid in the processing space and measure the concentration of the first fluid contained in the process fluid, and when the concentration of a chemical liquid measured at the predetermined time point is equal to or less than a set value, the controller may set the predetermined time point as an end time point in treating a second substrate to be processed after the first substrate.

Another exemplary embodiment of the present invention provides an apparatus for measuring a concentration, the apparatus including: a measurement line; a concentration meter for measuring a concentration of a first fluid contained in a fluid in the measurement line; a sampling line for transferring a process fluid of a processing space in which a substrate is treated in a high-pressure environment to the measurement line; a control valve for opening and closing the sampling line; a fluid pressure regulator installed downstream the control valve in the sampling line and configured to adjust the passing fluid to a set pressure; a decompression tank installed between the sampling line and the measurement line; and a controller, in which the controller opens the control valve to sample the process fluid at a predetermined time point during the progress of the treatment of the substrate with the process fluid in the processing space, and measures the concentration of the first fluid contained in the process fluid.

In the exemplary embodiment, the control valve may open for a few seconds and then close.

In the exemplary embodiment, when the concentration of the first fluid measured by the concentration meter is equal to or less than a set value, the treatment of the substrate by using the process fluid may be terminated.

In the exemplary embodiment, the apparatus may further include a controller, in which the controller may set the control valve to an open state at a predetermined time point during the progress of the treatment of a first substrate with the process fluid in the processing space and measure the concentration of the first fluid contained in the process fluid, and when the concentration of a chemical liquid measured at the predetermined time point is equal to or less than a set value, the controller may set the predetermined time point as an end time point in treating a second substrate to be processed after the first substrate.

In the exemplary embodiment, the apparatus may further include an exhaust line for exhausting an atmosphere of the processing space, in which the sampling line may be connected to the exhaust line.

In the exemplary embodiment, the concentration meter may measure the concentration in a state in which a fluid in the measurement line flows.

In the exemplary embodiment, the process fluid may be supercritical carbon dioxide, and the first fluid may be isopropyl alcohol (IPA).

Still another exemplary embodiment of the present invention provides an apparatus for treating a substrate, the apparatus including: a vessel having a processing space for treating a substrate with a process fluid in a high-pressure environment; an exhaust line for exhausting an atmosphere of the processing space; a sampling line connected to the exhaust line and for opening and closing the sampling line; a control valve installed in the sampling line; a fluid pressure regulator installed downstream the control valve in the sampling line and configured to adjust the passing fluid to a set pressure; a decompression tank connected downstream the fluid pressure regulator; a purge gas supply line connected to the decompression tank; a purge valve installed in the purge gas supply line; a vent line for venting a fluid in the decompression tank; a vent valve installed on the vent line; a measurement line for discharging the fluid from the decompression tank; a concentration meter provided to the measurement line to measure a concentration of a chemical liquid contained in the fluid while the fluid flows; and a controller, in which the controller opens the control valve for several seconds to sample the process fluid at a predetermined time point during the progress of the treatment of the substrate with the process fluid in the processing space, and measures the concentration of the first fluid contained in the process fluid.

In the exemplary embodiment, when the concentration of the first fluid measured by the concentration meter is equal to or less than a set value, the treatment of the substrate by using the process fluid may be terminated.

In the exemplary embodiment, when the concentration of the first fluid measured at the predetermined time point is equal to or less than a set value, the predetermined time point may be set as an end time in treating a second substrate to be processed after a first substrate.

According to the exemplary embodiment of the present invention, it is possible to efficiently treat the substrate.

According to the exemplary embodiment of the present invention, it is possible to measure the concentration of the chemical liquid at a predetermined time point when the concentration measurement is desired even during the progress of the process.

According to the exemplary embodiment of the present invention, it is possible to monitor the concentration of the chemical liquid during the progress of the process, thereby improving process performance The effect of the present invention is not limited to the foregoing effects, and those skilled in the art may clearly understand non-mentioned effects from the present specification and the accompanying drawings.

Figure 12:
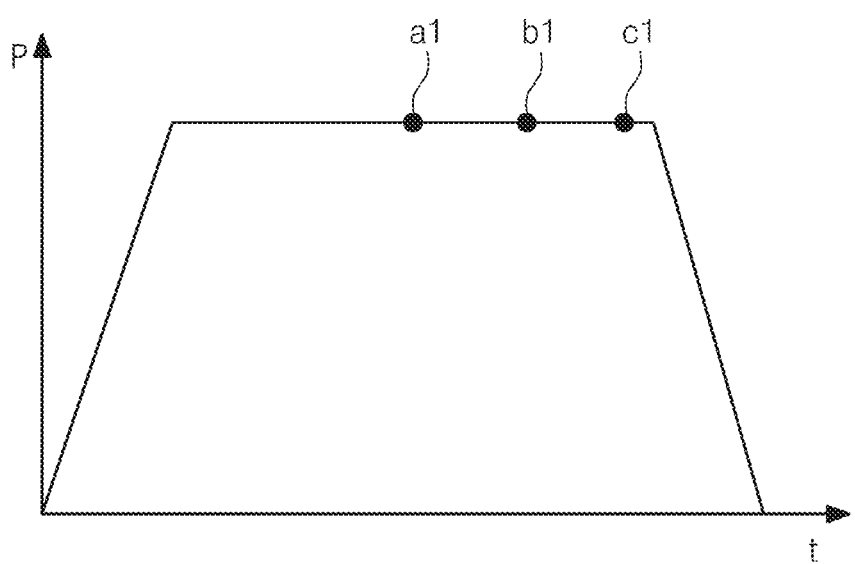
Figure 12:
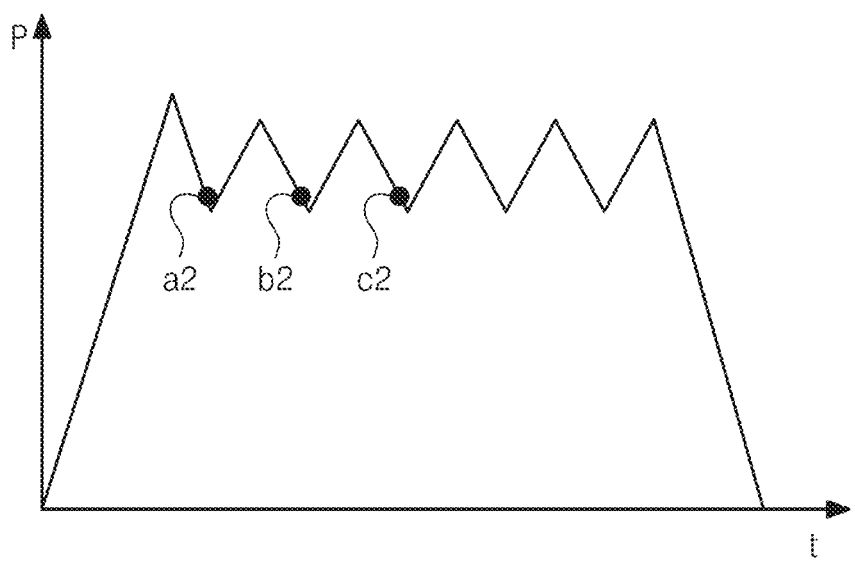

(a) and (b) of FIG. 12 are graphs showing changes in pressure Pin a processing space 502 over time during the process according to each embodiment.

DETAILED DESCRIPTION

Hereinafter, an exemplary embodiment of the present invention will be described in more detail with reference to the accompanying drawings. The exemplary embodiment of the present invention may be modified in various forms, and the scope of the present invention should not be construed as being limited to the following exemplary embodiments. This exemplary embodiment is provided to more completely explain the present invention to those of ordinary skill in the art. Therefore, the shapes of elements in the drawings are exaggerated to emphasize a clearer description.

Figure 1:
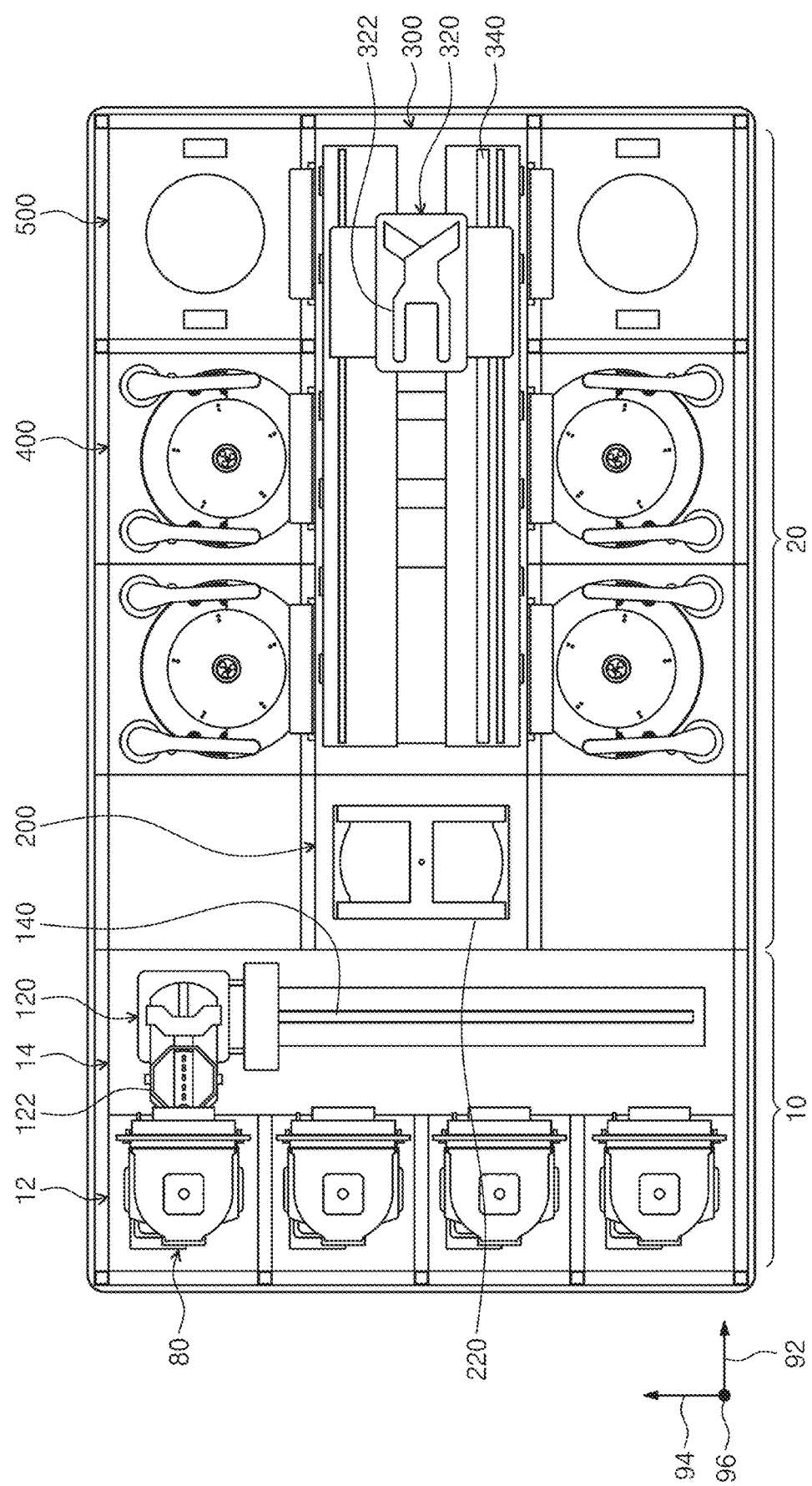
FIG. 1 is a top plan view schematically illustrating a substrate treating apparatus according to an exemplary embodiment of the present invention.

FIG. 1 is a top plan view schematically illustrating a substrate treating system according to an exemplary embodiment of the present invention. Referring to FIG. 1, the substrate treating system includes an index module 10, a treating module 20, and a controller (not illustrated). According to the exemplary embodiment, the index module 10 and the treating module 20 are disposed in one direction. Hereinafter, the direction in which the index module 10 and the treating module 20 are disposed is referred to as a first direction 92, and when viewed from above, a direction vertical to the first direction 92 is referred to as a second direction 94, and a direction vertical to both the first direction 92 and the second direction 94 is referred to as a third direction 96.

The index module 10 transfers a substrate W from a container 80 in which the substrate W is accommodated to the treating module 20, and makes the substrate W, which has been completely treated in the treating module 20, be accommodated in the container 80. A longitudinal direction of the index module 10 is provided in the second direction 94. The index module 10 includes a load port 12 and an index frame 14. Based on the index frame 14, the load port 12 is located at a side opposite to the treating module 20. The container 80 in which the substrates W are accommodated is placed on the load port 12. The load port 12 may be provided in plurality, and the plurality of load ports 12 may be disposed in the second direction 94.

As the container 80, an airtight container, such as a Front Open Unified Pod (FOUP), may be used. The container 80 may be placed on the load port 12 by a transport means (not illustrated), such as an overhead transfer, an overhead conveyor, or an automatic guided vehicle, or an operator.

An index robot 120 is provided to the index frame 14. A guide rail 140 of which a longitudinal is the second direction 94 is provided within the index frame 14, and the index robot 120 may be provided to be movable on the guide rail 140. The index robot 120 includes a hand 122 on which the substrate W is placed, and the hand 122 may be provided to be movable forward and backward, rotatable based on the third direction 96 as an axis, and movable in the third direction 96. The plurality of hands 122 is provided while being spaced apart from each other in the vertical direction, and is capable of independently moving forward and backward.

The treating module 20 includes a buffer unit 200, a transport device 300, a liquid processing device 400, and a supercritical device 500. The buffer unit 200 provides a space in which the substrate W loaded to the treating module 20 and the substrate W unloaded from the treating module 20 stay temporarily. The liquid processing device 400 performs a liquid processing process of supplying a liquid onto the substrate W and treating the substrate W with the liquid. The supercritical device 500 performs a drying process of removing the liquid left on the substrate W. The transfer device 300 transfers the substrate W between the buffer unit 200, the liquid processing device 400, and the supercritical device 500.

A longitudinal direction of the transport device 300 may be the first direction 92. The buffer unit 200 may be disposed between the index module 10 and the transport device 300. The liquid treating device 400 and the supercritical device 500 may be disposed on a lateral portion of the transport device 300. The liquid treating device 400 and the transport device 300 may be disposed in the second direction 94. The supercritical device 500 and the transport device 300 may be disposed in the second direction 94. The buffer unit 200 may be positioned at one end of the transport device 300.

According to one example, the liquid treating devices 400 may be disposed at both sides of the transport device 300, the supercritical devices 500 may be disposed at both sides of the transport device 300, and the liquid treating devices 400 may be disposed at positions closer to the buffer unit 200 than the supercritical devices 500. At one side of the transport device 300, the liquid treating devices 400 may be provided in an arrangement of A ?B (each of A and B is 1 or a natural larger than 1) in the first direction 92 and the third direction 96. At one side of the transport device 300, the supercritical devices 500 may be provided in number of C ?D (each of C and D is 1 or a natural larger than 1) in the first direction 92 and the third direction 96. Unlike the description, only the liquid treating devices 400 may be provided at one side of the transport device 300, and only the supercritical devices 500 may be provided at the other side of the transport device 300.

The transport device 300 includes a transport robot 320. A guide rail 340, of which a longitudinal direction is the first direction 92, is provided within the transport device 300, and the transport robot 320 may be provided to be movable on the guide rail 340. The transfer robot 320 includes a hand 322 on which the substrate W is placed, and the hand 322 may be provided to be movable forward and backward, rotatable based on the third direction 96 as an axis, and movable in the third direction 96. A plurality of hands 322 are provided while being vertically spaced apart from each other, and the hands 322 may move forward and backward independently of each other.

The buffer unit 200 includes a plurality of buffers 220 on which the substrate W is placed. The buffers 220 may be disposed while being spaced apart from each other in the third direction 96. A front face and a rear face of the buffer unit 200 are opened. The front face is the face facing the index module 10, and the rear face is the face facing the transport device 300. The index robot 120 may approach the buffer unit 200 through the front face, and the transfer robot 320 may approach the buffer unit 200 through the rear face.

Figure 2:
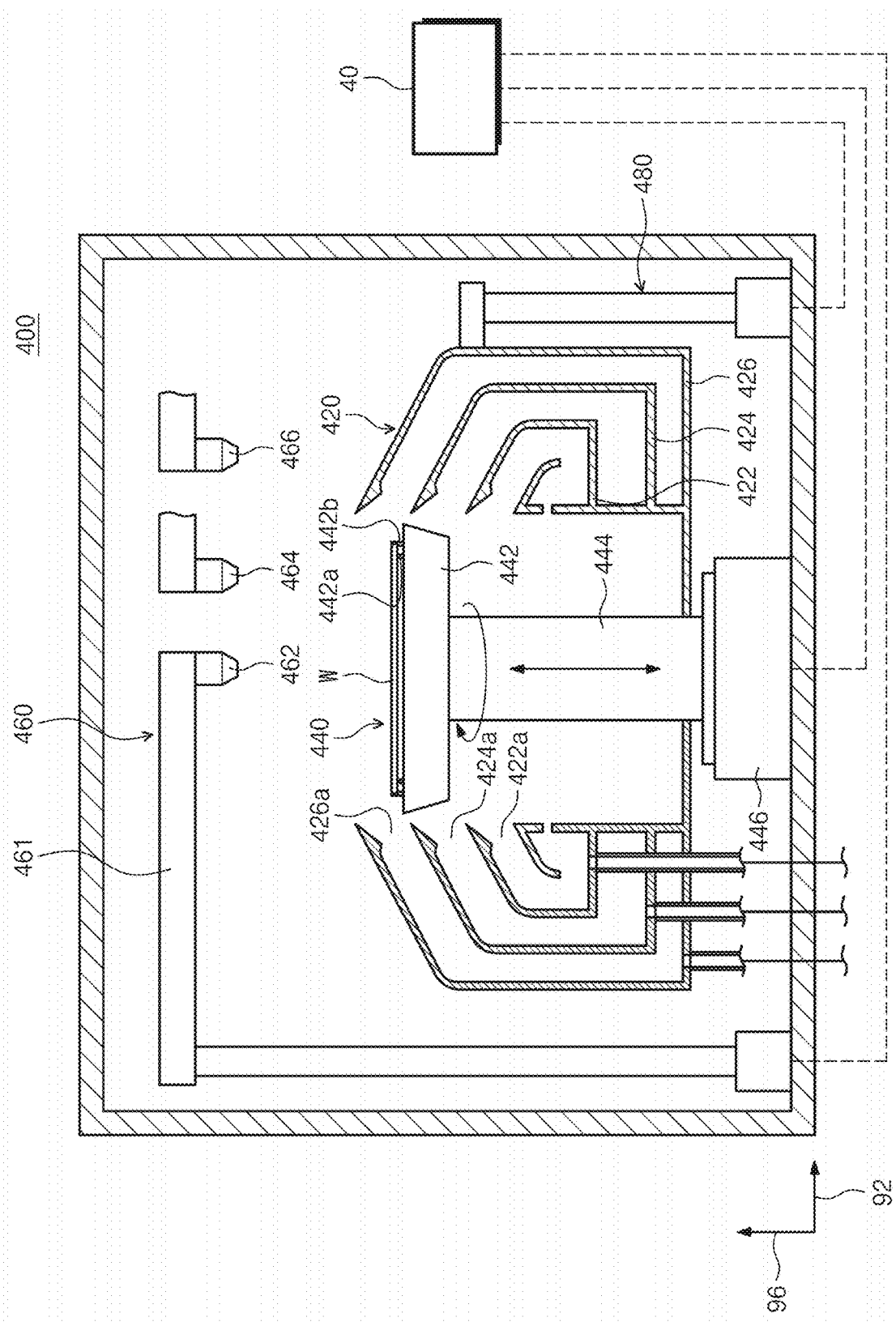
FIG. 2 is a cross-sectional view schematically illustrating an embodiment of a liquid processing device of FIG. 1.

FIG. 2 is a diagram schematically illustrating the liquid processing device 400 of FIG. 1 according to the exemplary embodiment of the present invention. Referring to FIG. 2, the liquid treating device 400 includes a housing 410, a cup 420, a support unit 440, a liquid supply unit 460, a lifting unit 480, and a control unit 40. The control unit 40 controls the operations of the liquid supply unit 460, the support unit 440, and the lifting unit 480. The housing 410 is provided in a generally rectangular parallelepiped shape. The cup 420, the support unit 440, and the liquid supply unit 460 are disposed in the housing 410.

The cup 420 has a treatment space having an open top, and the substrate W is liquid-treated within the treatment space. The support unit 440 supports the substrate W within the treatment space. The liquid supply unit 460 supplies the liquid onto the substrate W supported by the support unit 440. The liquid may be provided in a plurality of types, and may be sequentially supplied onto the substrate W. The lifting unit 480 adjusts a relative height between the cup 420 and the support unit 440.

According to one example, the cup 420 includes a plurality of recovery containers 422, 424, and 426. Each of the recovery containers 422, 424, and 426 has a recovery space of recovering the liquid used for the treatment of the substrate. Each of the recovery containers 422, 424, and 426 is provided in a ring shape surrounding the support unit 440. The pre-treatment liquid scattered by the rotation of the substrate W when the liquid treatment process progresses is introduced into the recovery space through inlets 422a, 424a, and 426a of the recovery containers 422, 424, and 426, respectively. According to one example, the cup 420 includes the first recovery container 422, the second recovery container 424, and the third recovery container 426. The first recovery container 422 is disposed to surround the support unit 440, the second recovery container 424 is disposed to surround the first recovery container 422, and the third recovery container 426 is disposed to surround the second recovery container 424. The second inlet 424a through which the liquid is introduced to the second recovery container 424 may be positioned above the first inlet 422a through which the liquid is introduced to the first recovery container 422, and the third inlet 426a through which the liquid is introduced to the third recovery container 426 may be positioned above the second inlet 424a.

The support unit 440 includes a support plate 442 and a driving shaft 444. An upper surface of the support plate 442 may be provided in a generally circular shape, and may have a diameter larger than a diameter of the substrate W. A support pin 442a supporting the rear surface of the substrate W is provided to a center portion of the support plate 442, and an upper end of the support pin 442a is provided to protrude from the support plate 442 so that the substrate W is spaced apart from the support plate 442 by a predetermined distance. A chuck pin 442b is provided to an edge of the support plate 442.

The chuck pin 442b is provided to protrude upward from the support plate 442, and supports the lateral portion of the substrate W so that the substrate W is not separated from the support unit 440 when the substrate W is rotated. The driving shaft 444 is driven by the driving member 446, and is connected with a center of the bottom surface of the substrate W, and rotates the support plate 442 based on a center axis of the support plate 442.

According to one example, the liquid supplying unit 460 includes a first nozzle 462, a second nozzle 464, and a third nozzle 446. The first nozzle 462 supplies a first liquid onto the substrate W. The first liquid may be the liquid of removing a film or foreign substances left on the substrate W. The second nozzle 464 supplies a second liquid onto the substrate W. The second liquid may be the liquid well soluble in a third liquid. For example, the second liquid may be the liquid that is better soluble in the third liquid than the first liquid. The second liquid may be the liquid that neutralizes the first liquid supplied onto the substrate W. Further, the second liquid may be the liquid that neutralizes the first solution and at the same time is better soluble in the third solution than the first solution.

According to one example, the second liquid may be water. The third nozzle 466 supplies the third liquid onto the substrate W. The third liquid may be the liquid well soluble in a supercritical fluid used in the supercritical device 500. For example, the third liquid may be the liquid that is better soluble in the supercritical fluid used in the supercritical device 500 than the second liquid. According to an example, the third liquid may be an organic solvent. The organic solvent may be isopropyl alcohol (IPA). For example, the supercritical fluid may be carbon dioxide.

The first nozzle 462, the second nozzle 464, and the third nozzle 466 may be supported by different arms 461, and the arms 461 may be independently moved. Optionally, the first nozzle 462, the second nozzle 464, and the third nozzle 466 may be mounted to the same arm and moved at the same time.

The lifting unit 480 moves the cup 420 in the vertical direction. By the vertical movement of the cup 420, a relative height between the cup 420 and the substrate W is changed. Through this, the recovery containers 422, 424, and 426 to which a pre-treatment liquids are recovered are changed according to the type of liquid supplied to the substrate W, so that it is possible to separate and recover the liquids. Unlike the description, the cup 420 may be fixedly installed, and the lifting unit 480 may move the support unit 440 in the vertical direction.

Figure 3:
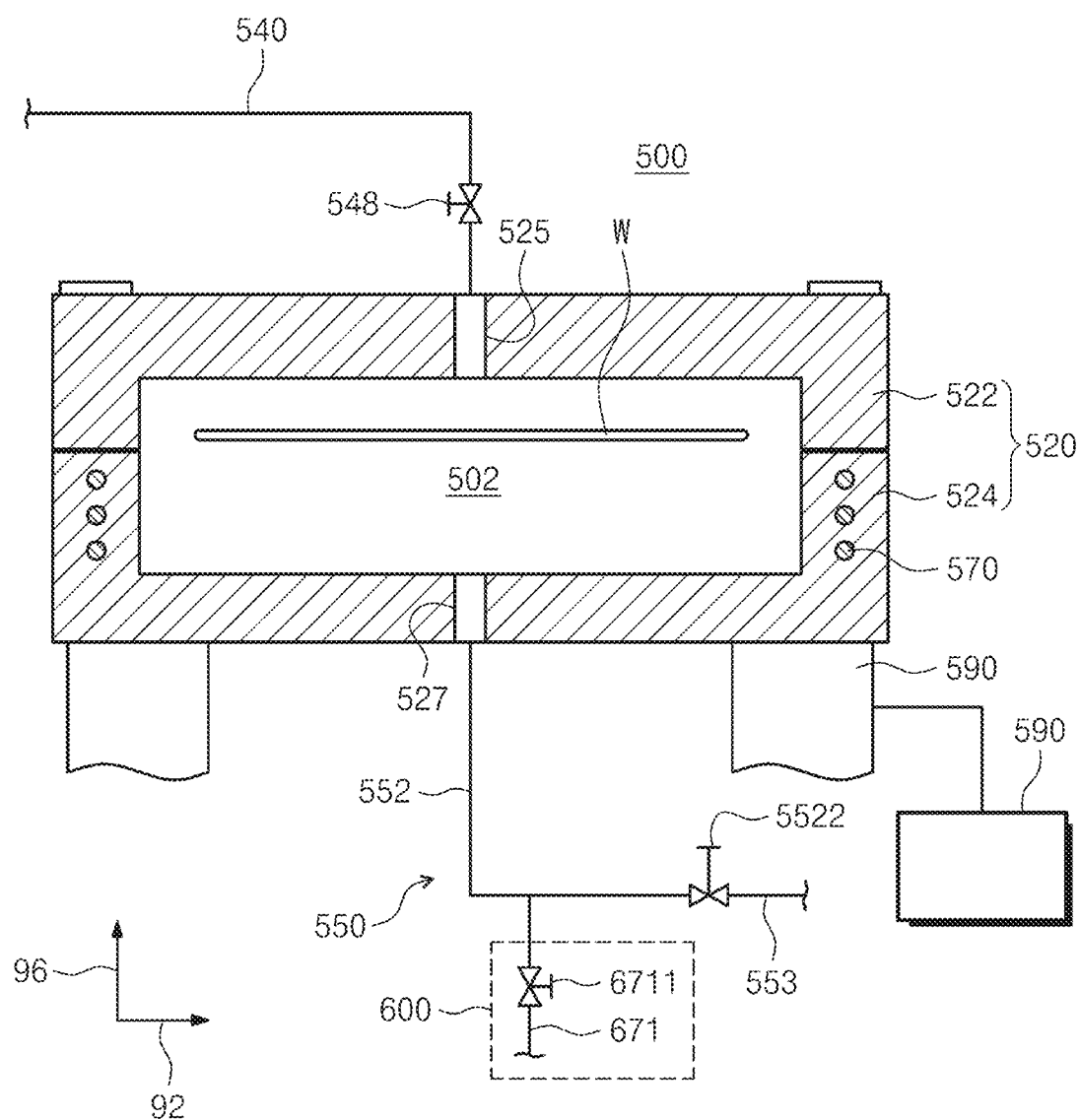
FIG. 3 is a cross-sectional view schematically illustrating an embodiment of a supercritical device of FIG. 1.

FIG. 3 is a diagram schematically illustrating an exemplary embodiment of the supercritical device 500 of FIG. 1. According to the exemplary embodiment, the supercritical device 500 removes the liquid on the substrate W by using the supercritical fluid. According to the exemplary embodiment, the liquid on the substrate W may be IPA. The supercritical device 500 removes the IPA from the substrate W by supplying the supercritical fluid onto the substrate and dissolving the IPA on the substrate W in the supercritical fluid.

Referring to FIG. 3, the supercritical device 500 includes a vessel 520, a fluid supply line 540, a support member 580, a driving member 590, and an exhaust unit 550.

The vessel 520 provides a processing space 502 in which a supercritical process is performed. In one example, the vessel 520 may be provided in a cylindrical shape. Otherwise, unlike this, the vessel 520 may be provided in a cuboid shape. The vessel 520 includes a first body 522 and a second body 524. The first body 522 and the second body 524 are combined with each other to provide the processing space 502 described above. In one example, the first body 522 is provided in a circular shape when viewed from above. Similarly, the second body 524 is provided in a circular shape when viewed from above. In one example, the first body 522 is provided on top of the second body 524. Optionally, the first body 522 and the second body 524 may be provided at the same height, and the first body 522 and the second body 524 may be opened and closed from side to side.

When the first body 522 is spaced apart from the second body 524, the processing space 502 is opened, and at this time, the substrate W is loaded or unloaded. The driving member 590 raises and lowers any one of the first body 522 and the second body 524 so that the vessel 520 moves to the open position or the closed position.

In one example, the driving member 590 may be provided to drive a cylinder that raises and lowers the first body 522 or the second body 524. For example, the driving member 590 may be provided to raise and lower the second body 524. Here, the open position is a position where the first body 522 and the second body 524 are spaced apart from each other, and the closed position is a position where the contact surfaces of the first body 522 and the second body 524 facing each other are in close contact with each other. That is, in the open position, the processing space 502 is opened from the outside, and in the closed position, the processing space 502 is closed to the outside.

In one example, a first discharge hole 525 to which a first supply line 542 is connected may be formed in the first body 522. A fluid may be supplied to the processing space 502 through the first discharge hole 525. In one example, a second discharge hole 526 to which a second supply line 562 is connected and an exhaust hole 527 to which an exhaust line 552 is connected may be formed in the second body 524. Optionally, only one of the first discharge hole 525 and the second discharge hole 526 may be provided in the vessel 520.

In one example, a heater 570 is provided inside the wall of the vessel 520. The heater 570 heats the processing space 502 of the vessel 520 so that the fluid supplied into the interior space of the vessel 520 maintains a supercritical state. An atmosphere by the supercritical fluid is formed inside the processing space 502.

The support member 580 supports the substrate W in the processing space 502 of the vessel 520. The substrate W loaded into the processing space 502 of the vessel 520 is placed on the support member 580. According to an example, the substrate W is supported by the support member 580 such that the pattern surface faces upward. In one example, the support member 580 supports the substrate W above the second discharge hole 526. In one example, the support member 580 may be coupled to the first body 522. Optionally, the support member 580 may be coupled to the second body 524.

In addition, the exhaust unit 550 is coupled to the second body 524. The exhaust unit 550 exhausts the atmosphere of the processing space 502. The supercritical fluid in the processing space 502 is exhausted to the outside of the vessel 520 through the exhaust unit 550. The exhaust unit 550 includes exhaust lines 552 and 553 and an exhaust valve 5522. The exhaust valve 5522 is installed in the exhaust lines 552 and 553 to control whether the processing space 502 is exhausted and an exhaust flow rate.

Figure 4:
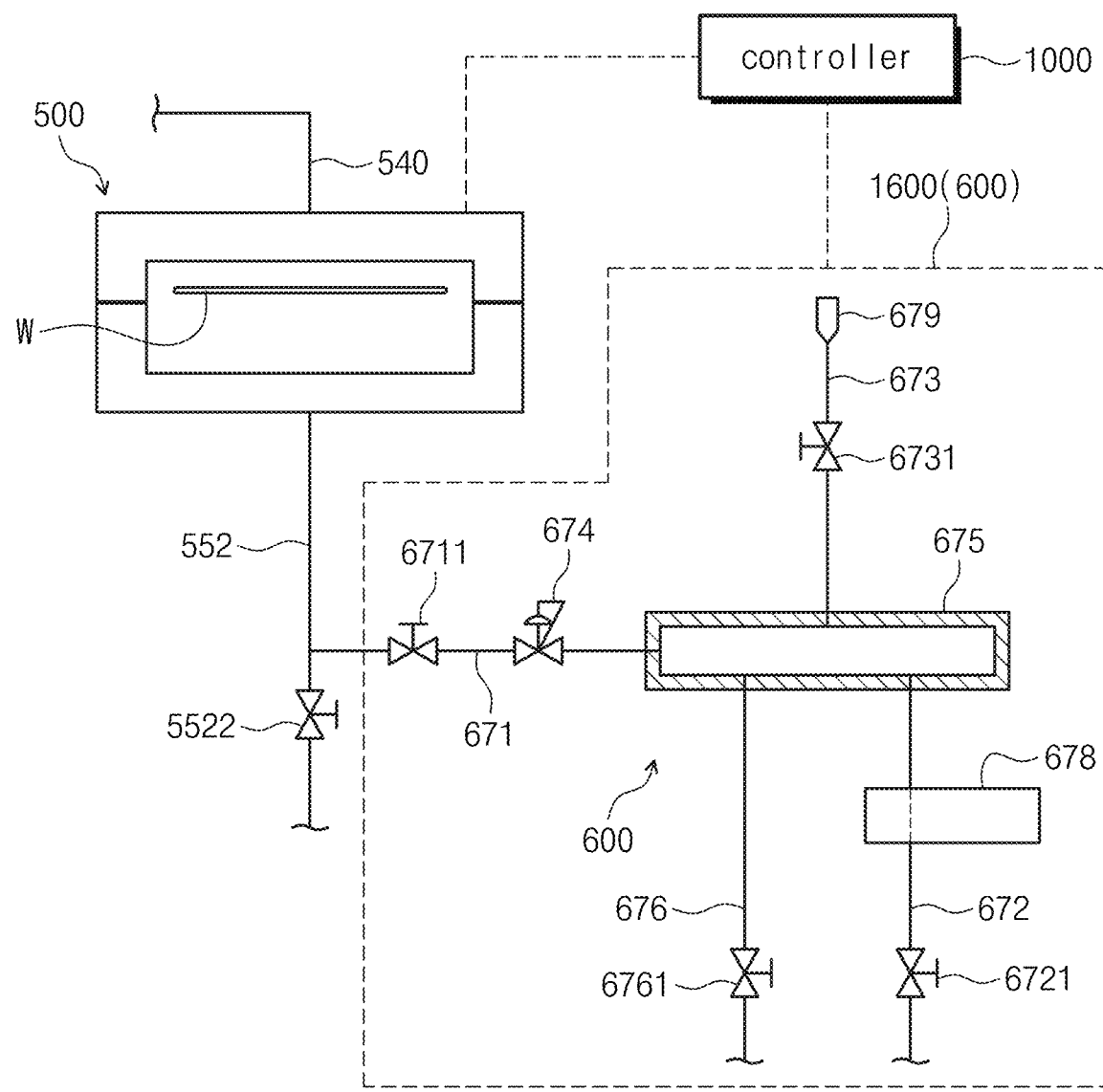
FIG. 4 is a cross-sectional view schematically showing an example 1600 of a concentration measuring apparatus 600 applied to the supercritical device.

FIG. 4 is a cross-sectional view schematically showing an example 1600 of a concentration measuring apparatus 600 applied to the supercritical device. The description will be given with reference to FIG. 4.

In one example, a sampling line 671 is provided while being connected to the exhaust line 522. The sampling line 671 may be connected to the exhaust line 522 upstream where the exhaust valve 5522 is provided. The fluid in the processing space 502 may be transmitted to a sampling line 671. Unlike the illustration, the sampling line 671 may also be directly connected to the processing space 502. That is, the sampling line 671 may be directly connected to the vessel 520 without passing through the exhaust line 552.

In one example, a control valve 6711 is installed in the sampling line 671. The control valve 6711 opens and closes the flow of the fluid flowing to the sampling line 671.

In one example, a fluid pressure regulator 674 is installed downstream the control valve 6711 in the sampling line 671. In one example, the fluid pressure regulator 674 may be provided as a fluid regulator. The fluid pressure regulator 674 causes the fluid passing through the fluid pressure regulator 674 to be regulated to a set pressure. For example, when the pressure of the fluid at the primary side (inlet side) of the fluid pressure regulator 674 is a first pressure, the pressure of the fluid at the secondary side (outlet side) is regulated to a second pressure. In the embodiment of the present invention, the second pressure is a pressure lower than the first pressure. It is difficult to measure the concentration of a high pressure fluid. The fluid pressure regulator 674 controls the pressure of the fluid so that a concentration meter 678 to be described later can measure the concentration of the chemical liquid contained in the process fluid.

The concentration meter 678 measures the concentration of the chemical liquid contained in the process fluid. The concentration meter 678 measures the concentration of the chemical liquid contained in the fluid flowing through a pipe 672 located downstream the fluid pressure regulator 674. In one example, the chemical liquid to be measured is IPA, and the process fluid is supercritical carbon dioxide.

A decompression tank 675 may be further provided between the concentration meter 678 and the fluid pressure regulator 674. The decompression tank 675 is formed with a predetermined volume therein. The decompression tank 675 secondly depressurizes the fluid of which the pressure has been reduced through the fluid pressure regulator 674.

A measurement line 672 vents the gas inside the decompression tank 675. A vent valve 6721 is installed in the measurement line 672. The concentration meter 678 may be installed upstream the first vent valve 6721. The concentration meter 678 measures the concentration in a state in which the first vent valve 6721 is opened and the process fluid flows.

The vent line 676 vents the gas inside the decompression tank 675. The vent line 676 is connected to the decompression tank 675. A second vent valve 6761 is installed in the vent line 676. The diameter of the vent line 676 may be larger than the diameter of the measurement line 672. The vent line 676 is applied to discharge the process fluid remaining in the decompression tank 675 after the concentration is measured. When purge gas, which will be described later, is introduced, the process fluid remaining in the decompression tank 675 may be rapidly discharged through the vent line 676.

A purge gas supply line 673 is connected to the decompression tank 675. A purge valve 6731 is installed in the purge gas supply line 673. Purge gas may be introduced into the decompression tank 675 through the purge gas supply line 673. After the measurement of the concentration of the purge gas is completed, the fluid remaining in the decompression tank 675 is purged and removed by the decompression tank 675. The purge gas may be provided as inert gas. The purge gas may be nitrogen gas.

Figure 5:
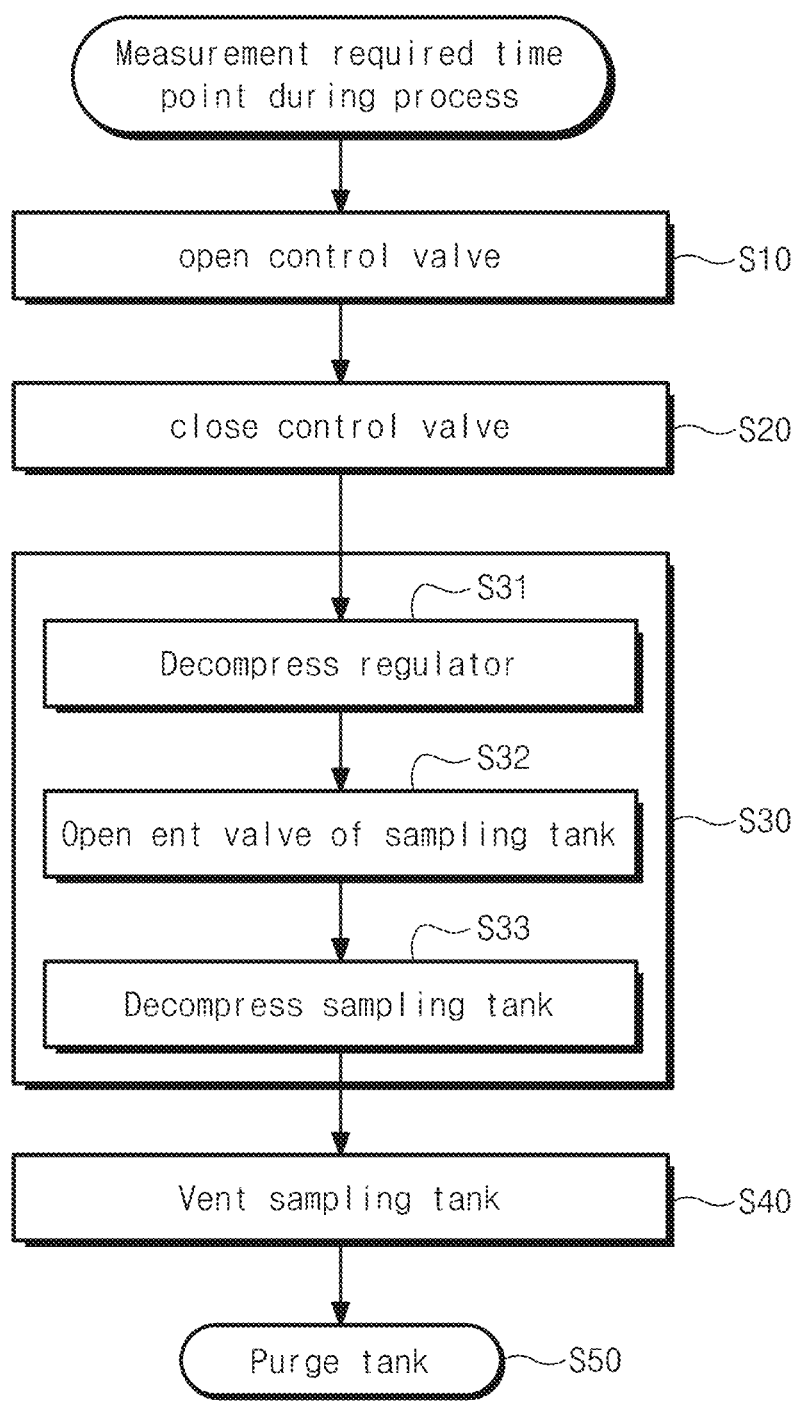
FIG. 5 is a flowchart illustrating a concentration measuring method according to an embodiment of the present invention.

FIG. 5 is a flowchart illustrating a concentration measuring method according to an embodiment of the present invention. FIGS. 6 to 9 are diagrams sequentially listing the concentration measuring method by using the concentration measuring apparatus. A method for measuring the concentration of a chemical liquid will be described with reference to FIGS. 5, and 6 to 9.

A controller 1000 executes the control of the supercritical device 500 and the concentration measuring apparatus 600. The controller 1000 may control components of the supercritical device 500 and the concentration measuring apparatus 600 so that the substrate is treated according to a setting process. The controller 1000 may include a process controller formed of a microprocessor (computer) that executes the control of the substrate treating system, a user interface formed of a keyboard in which an operator performs a command input operation or the like in order to manage the substrate treating apparatus, a display for visualizing and displaying an operation situation of the substrate treating apparatus, and the like, and a storage unit storing a control program for executing the process executed in the substrate treating system under the control of the process controller or a program, that is, a treatment recipe, for executing the process in each component according to various data and treatment conditions.

Figure 6:
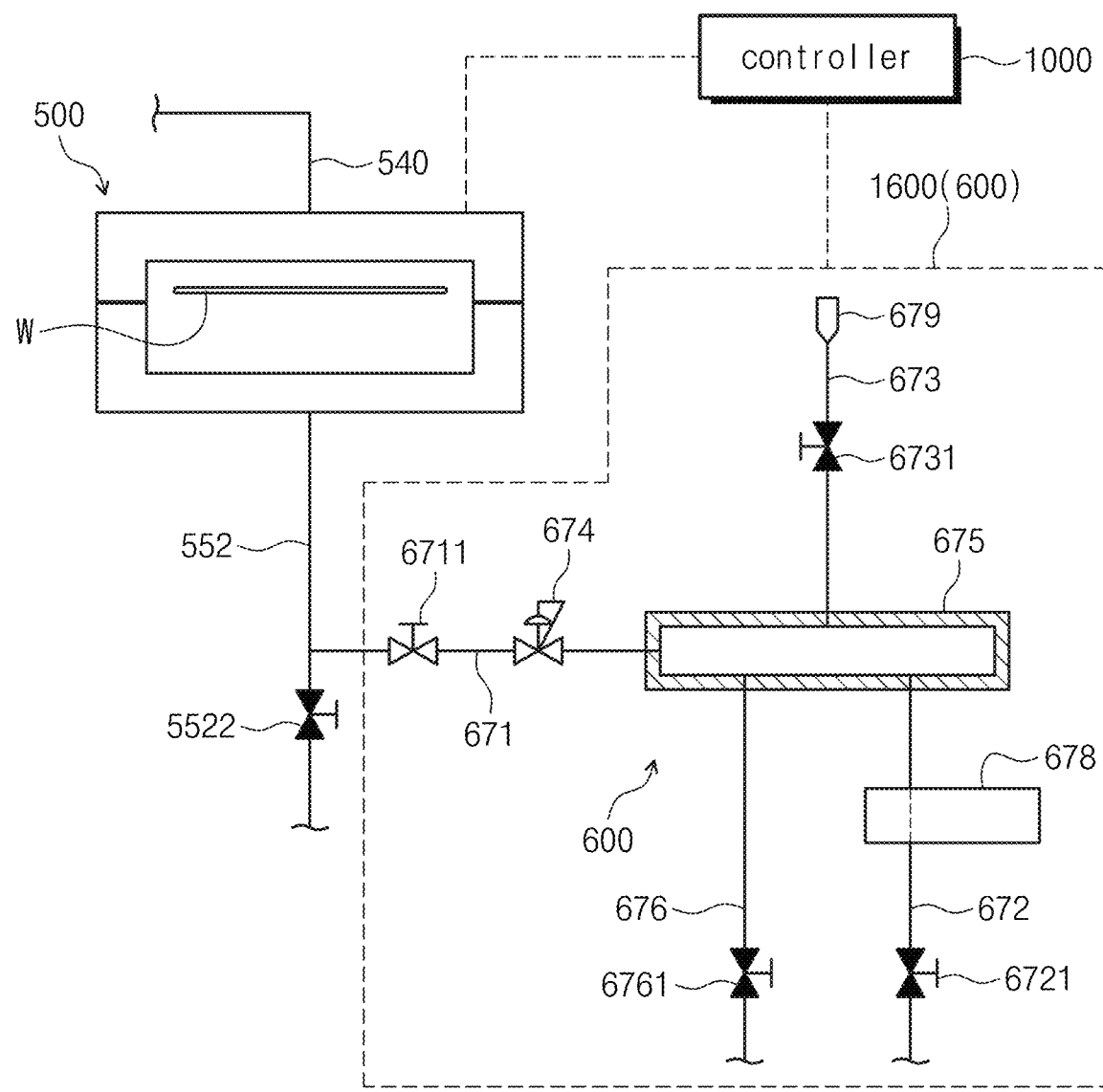
FIGS. 6 to 9 are diagrams sequentially listing the concentration measuring method by using the concentration measuring apparatus.

The description will be given with reference to FIGS. 5 and 6. The control valve 6711 is opened for a short time at a predetermined time point during the process (S10). The short time described above may be several seconds. The predetermined time point during the process will be described with reference to FIG. 12. (a) and (b) of FIG. 12 are graphs showing changes in pressure P in the processing space 502 over time during the process according to each embodiment. Referring to (a) of FIG. 10, when the inside of the processing space 502 reaches a set pressure by the processing liquid, the internal pressure of the processing space 502 is maintained while performing supply and exhaust. In this case, any time point, such as a1, b1, and c1, while the internal pressure is maintained may be the predetermined time point. Referring to (b) of FIG. 12, when the inside of the processing space 502 reaches a set pressure by the processing liquid, a cycle for changing the internal pressure by performing supply and exhaust is performed. In this case, any time point, such as a2, b2, and c2, during the operation of exhausting the internal pressure may be the predetermined time point. The predetermined point may be selected as necessary in addition to those described above.

Figure 7:
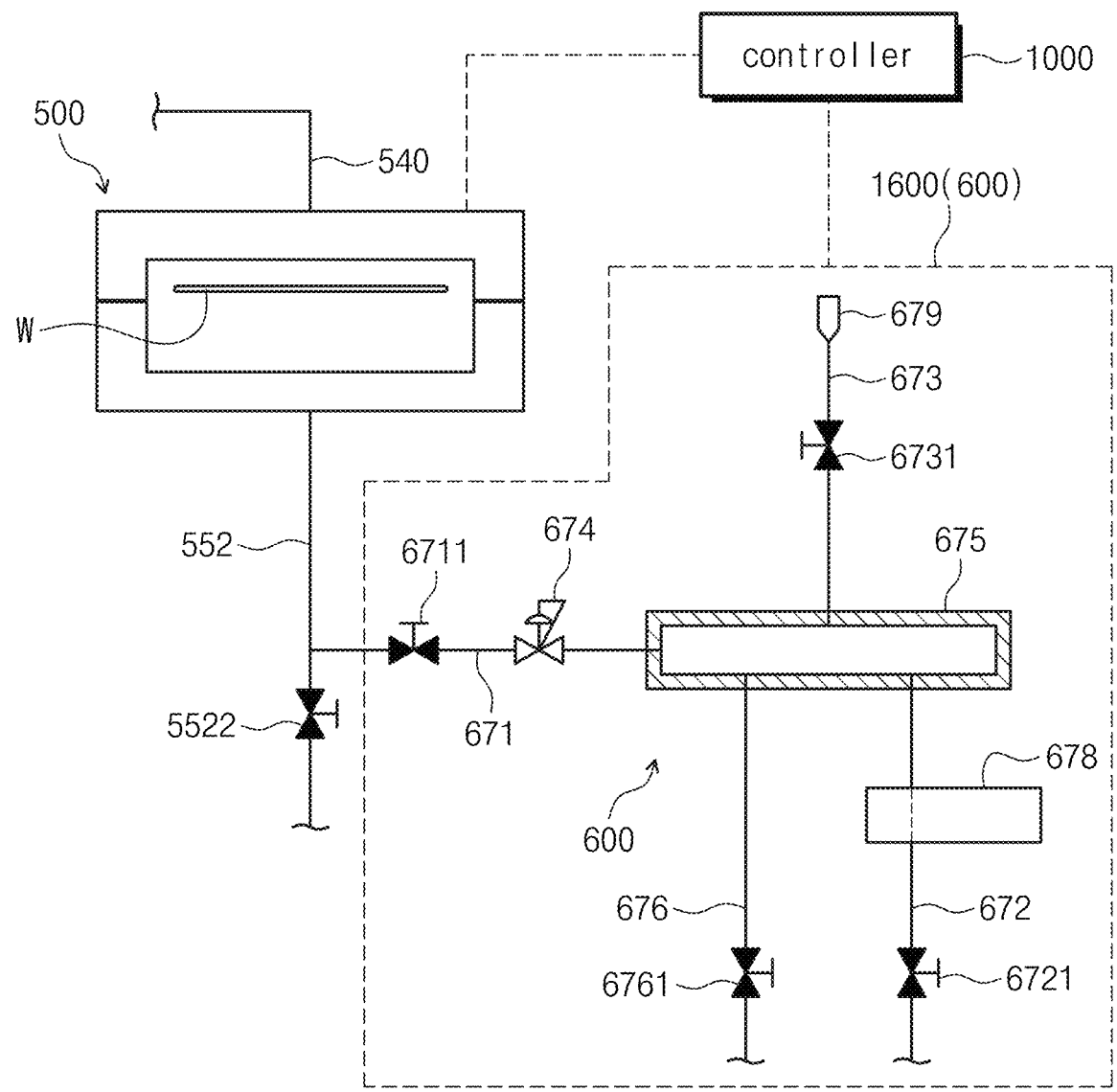
Figure 8:
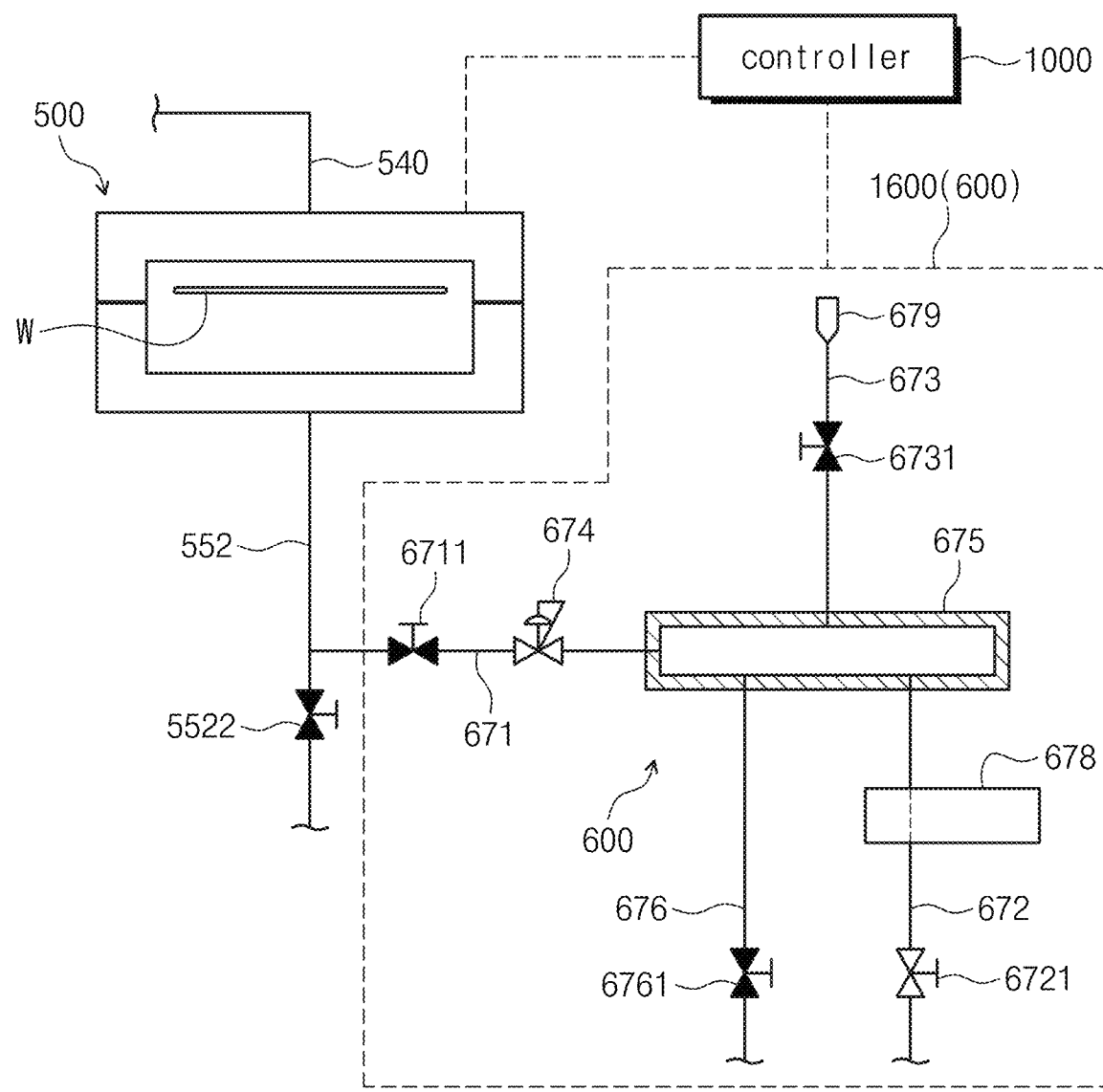

The description will be given with reference to FIGS. 5, 7, and 8. The control valve 6711 is closed (S20). The fluid collected while the control valve 6711 is opened for the short time passes through the fluid pressure regulator 674 and is primarily decompressed (S31). The fluid passing through the fluid pressure regulator 674 enters the decompression tank 675 and is secondarily decompressed (S33). Since the inside of the decompression tank 675 provides a larger volume than that of the pipe 671, the secondary decompression may be achieved. The fluid is decompressed to a pressure at which the concentration measuring apparatus 687 can measure the concentration. The first vent valve 6721 of the measurement line 672 is set to an open state (S32). The concentration meter 678 measures the concentration of the chemical liquid in the fluid flowing through the measurement line 672 while the operations S31 to S33 are in progress (S30). When the measurement is completed, it is preferable to close the first vent valve 6721 to prevent the fluid from flowing back.

Figure 9:
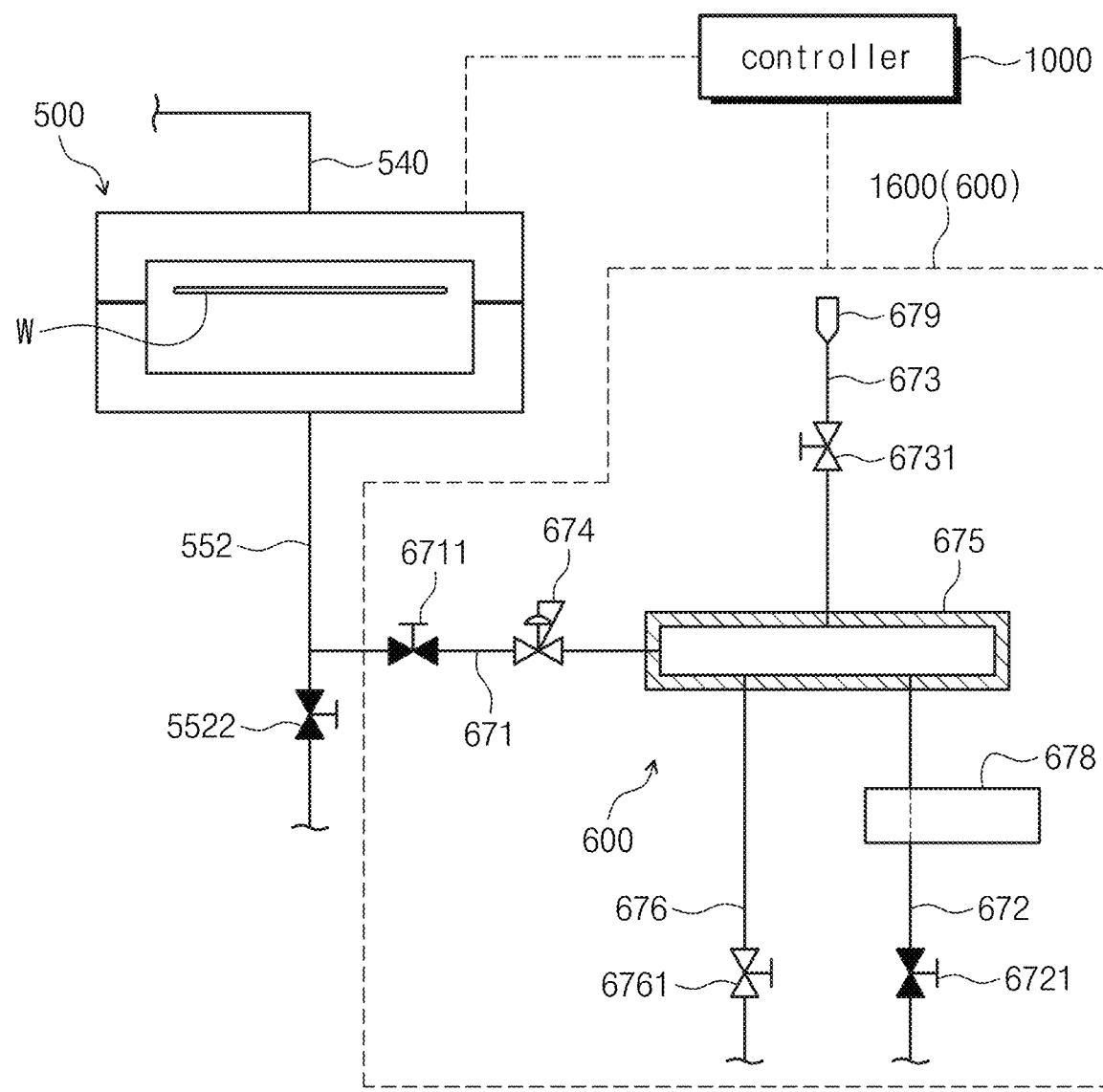

The description will be given with reference to FIGS. 5 and 9. When the concentration measurement is completed, the second vent valve 6761 is opened and the decompression tank 675 is vented through the vent line 676 (S40). And the inside of the decompression tank 675 is purged (S50). The purge gas is introduced into the decompression tank 675 through the purge gas supply line 673, and is discharged through the vent line 676. The purge gas may remove the fluid and the chemical liquid remaining in the decompression tank 675.

When the concentration measuring method described above is used, it is possible to measure the concentration of the chemical liquid in the processing liquid at the corresponding time point by opening the control valve 6711 at the desired time point to measure the concentration even under a high pressure condition during the process, so that it is possible to monitor the concentration of the internal chemical liquid according to the change in the process schedule, thereby expecting the improvement of process performance.

In one example, when the concentration of the chemical liquid (for example, IPA) measured by the concentration meter 678 at the predetermined time point is equal to or less than a set value, the treatment of the substrate W in progress in the supercritical device 500 may be terminated. Referring to FIG. 12, when the concentration of the chemical liquid measured at time point b1 is equal to or less than the set value, the treatment of the substrate W may be terminated even if a preset process time remains.

In another example, the controller 1000 may sample the process fluid by opening the control valve 6711 at the predetermined time point during processing of the treatment of the first substrate with the process fluid in the processing space 502, measure the concentration of the chemical liquid contained in the sampled processing liquid, and select the selected predetermined time point as an end time point in treating the second substrate to be processed after the first substrate when the concentration of the chemical liquid measured at the selected predetermined time point is equal to or less than the set value.

Figure 10:
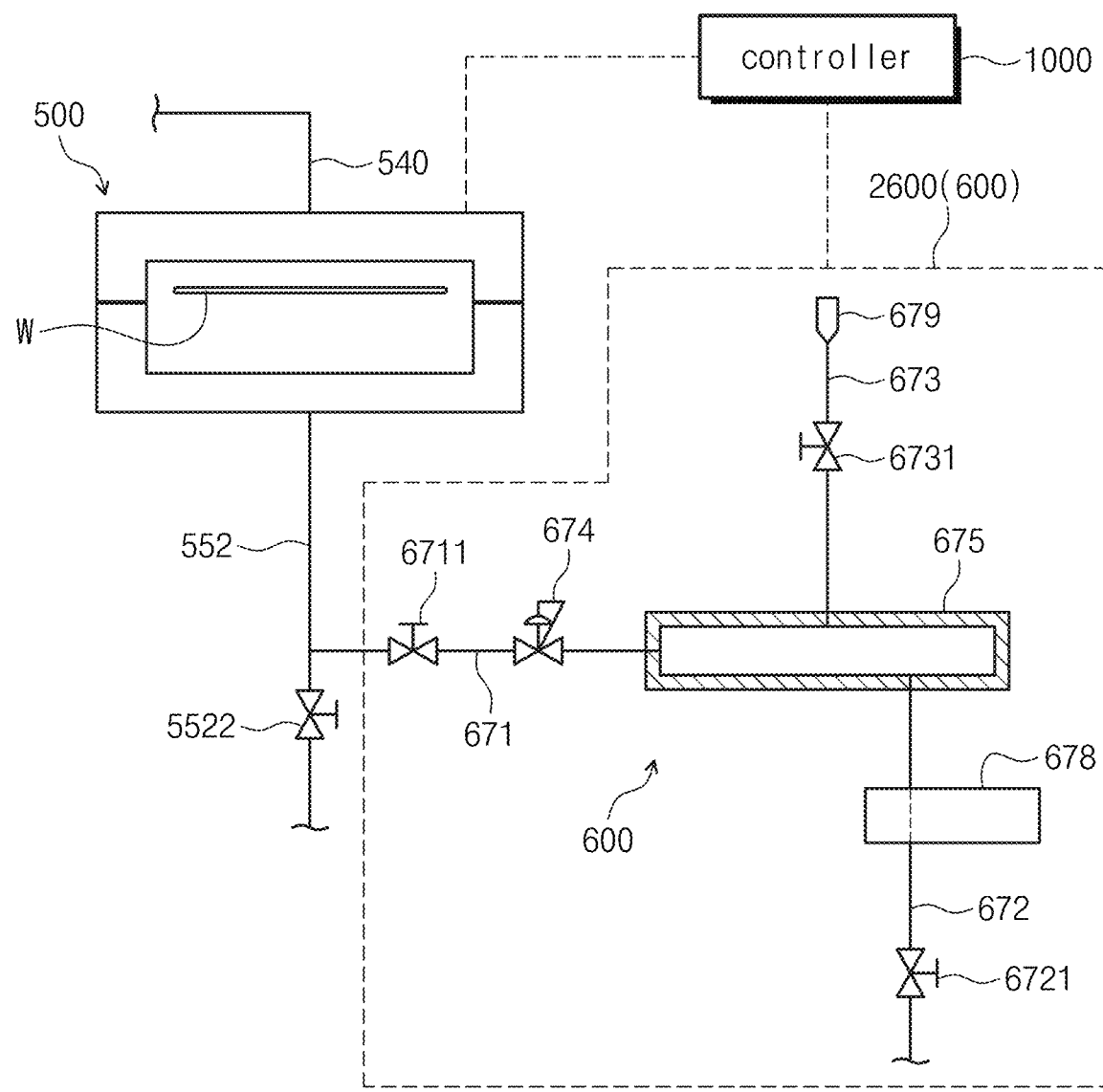
FIG. 10 is a cross-sectional view schematically showing another example 2600 of the concentration measuring apparatus 600 applied to the supercritical device.

FIG. 10 is a cross-sectional view schematically showing another example 2600 of the concentration measuring apparatus 600 applied to the supercritical device. In describing another example 2600 of the concentration measuring apparatus 600 with reference to FIG. 10, the same configuration as the description of the concentration measuring apparatus 1600 of FIG. 4 is replaced with the description of the concentration measuring apparatus 1600 of FIG. 4. In a concentration measuring apparatus 2600, the measurement line 672 may function as a vent line. Accordingly, unlike the concentration measuring apparatus 1600 of FIG. 4, the vent line 676 may be removed. In this case, the configuration of the device may be reduced. However, as the ventilation is performed through the measurement line 672, there may be a problem in that the measurement line 672 may be contaminated during venting, and a problem in which a fast venting speed cannot be obtained.

Figure 11:
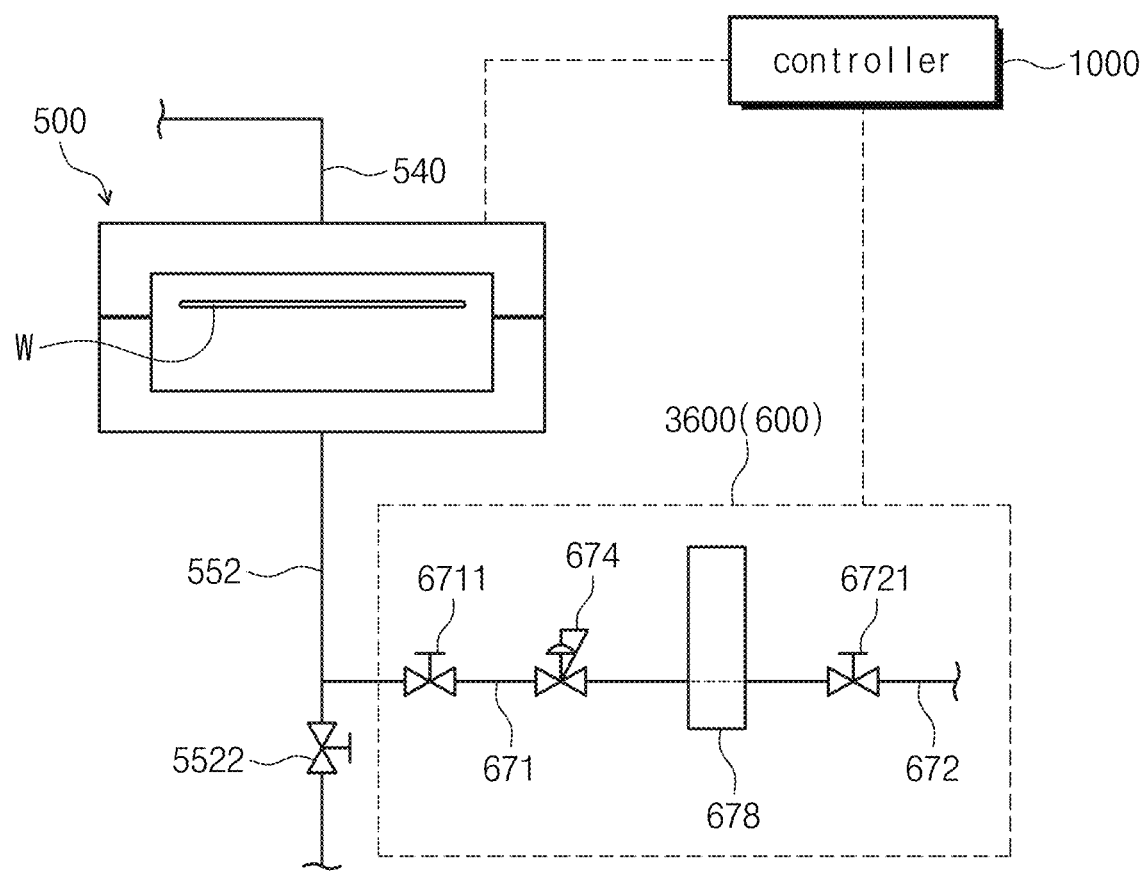
FIG. 11 is a cross-sectional view schematically showing another example 3600 of the concentration measuring apparatus 600 applied to the supercritical device.

FIG. 11 is a cross-sectional view schematically showing another example 3600 of the concentration measuring apparatus 600 applied to the supercritical device. In describing another example 3600 of the concentration measuring apparatus 600 with reference to FIG. 11, the same configuration as the description of the concentration measuring apparatus 1600 of FIG. 4 is replaced with the description of the concentration measuring apparatus 1600 of FIG. 4. Unlike the concentration measuring apparatus 1600 of FIG. 4, in the concentration measuring apparatus 3600, the decompression tank 675 may be removed. That is, it is possible to measure the concentration of the chemical liquid contained in the process fluid flowing through the measurement line 672 after the primary decompression without performing the secondary decompression. However, when the decompression tank 675 is removed, the process fluid on which only the first decompression has been performed flows through the measurement line 672, and in this case, the risk increases as the end of the measurement line 672 is a vent and accurate measurement may be difficult as the pressure is not sufficiently decompressed.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. In addition, the appended claims should be construed to include other exemplary embodiments as well.

What is claimed is:

1. An apparatus for measuring a concentration, the apparatus comprising:
   a measurement line;
   a concentration meter configured to measure a concentration of a first fluid contained in a process fluid in the measurement line;

a sampling line configured to transfer the process fluid of a processing space in which a substrate is treated to the measurement line;

a control valve configured to open and close the sampling line;

a fluid pressure regulator installed downstream the control valve in the sampling line and upstream a decompression tank, and configured to adjust a pressure of the process fluid passing therethrough such that a first pressure of the process fluid at an inlet side thereof is regulated to a second pressure of the process fluid at an outlet side thereof, the second pressure being lower than the first pressure;

the decompression tank installed between the sampling line and the measurement line; and a controller, wherein the controller is configured to open the control valve to sample the process fluid at a time point while treating the substrate with the process fluid in the processing space, and measure the concentration of the first fluid contained in the process fluid, and when the concentration of the first fluid measured by the concentration meter is equal to or less than a set value, the controller is further configured to terminate the treating of the substrate by using the process fluid.

2. The apparatus of claim 1, further comprising:
a purge gas supply line connected to the decompression tank; and
a purge valve installed in the purge gas supply line.

3. The apparatus of claim 2,
wherein when the concentration measurement by the concentration meter is completed, the controller is configured to supply purge gas to the decompression tank by opening the purge valve.

4. The apparatus of claim 2, further comprising:
a vent line connected to the decompression tank to vent an inside of the decompression tank; and
a vent valve installed in the vent line.

5. The apparatus of claim 4, wherein an inner diameter of the vent line is larger than an inner diameter of the measurement line.

6. The apparatus of claim 1, wherein the control valve is configured to open for several seconds and then close.

7. The apparatus of claim 1, further comprising:
an exhaust line configured to exhaust an atmosphere of the processing space,
wherein the sampling line is connected to the exhaust line.

8. The apparatus of claim 1, wherein the concentration meter is configured to measure the concentration in a state in which the process fluid in the measurement line flows.

9. An apparatus for measuring a concentration, the apparatus comprising:
a measurement line;
a concentration meter configured to measure a concentration of a first fluid contained in a process fluid in the measurement line;
a sampling line configured to transfer the process fluid of a processing space, in which a substrate is treated, to the measurement line;
a control valve configured to open and control the sampling line;
a fluid pressure regulator installed downstream the control valve in the sampling line and upstream a decompression tank, and configured to adjust a pressure of the process fluid passing therethrough such that a first pressure of the process fluid at an inlet side thereof is regulated to a second pressure of the process fluid at an outlet side thereof, the second pressure being lower than the first pressure;
the decompression tank installed between the sampling line and the measurement line; and
a controller,
wherein the controller is configured to set the control valve to an open state at a time point while treating a first substrate with the process fluid in the processing space and measure the concentration of the first fluid contained in the process fluid, and
when the concentration of the first fluid measured at the time point is equal to or less than a set value, the controller is configured to set the time point as an end time point in treating a second substrate to be processed after the first substrate.

10. An apparatus for measuring a concentration, the apparatus comprising:
a measurement line;
a concentration meter configured to measure a concentration of a first fluid contained in a process fluid in the measurement line;
a sampling line configured to transfer the process fluid of a processing space, in which a substrate is treated, to the measurement line;
a control valve configured to open and control the sampling line;
a fluid pressure regulator installed downstream the control valve in the sampling line and upstream a decompression tank, and configured to adjust a pressure of the process fluid passing therethrough such that a first pressure of the process fluid at an inlet side thereof is regulated to a second pressure of the process fluid at an outlet side thereof, the second pressure being lower than the first pressure; and
the decompression tank installed between the sampling line and the measurement line,
wherein the process fluid is supercritical carbon dioxide, and
the first fluid is isopropyl alcohol (IPA).

* * * * *